United States Patent
Fang et al.

(10) Patent No.: US 10,250,186 B1
(45) Date of Patent: Apr. 2, 2019

(54) DETACHABLE SPLIT SOLAR POWER OPTIMIZATION JUNCTION BOX MODULE

(71) Applicant: JIANGSU ENMAGIC ENERGY CO., LTD., Wuxi (CN)

(72) Inventors: Zheng Fang, Wuxi (CN); Jian Zuo, Wuxi (CN); Jian-Bin Tong, Wuxi (CN); Ke Wang, Wuxi (CN)

(73) Assignee: Jiangsu Enmagic Energy Co., Ltd., Jiangsu (CN)

( * ) Notice: Subject to any disclaimer, the term of this patent is extended or adjusted under 35 U.S.C. 154(b) by 0 days.

(21) Appl. No.: 15/837,183

(22) Filed: Dec. 11, 2017

(30) Foreign Application Priority Data

Oct. 26, 2017 (CN) .................... 2017 2 1394645 U

(51) Int. Cl.
| | |
|---|---|
| *H02S 40/34* | (2014.01) |
| *H02G 3/03* | (2006.01) |
| *H02G 3/08* | (2006.01) |
| *H02G 3/14* | (2006.01) |
| *H05K 7/20* | (2006.01) |
| *H05K 1/02* | (2006.01) |

(52) U.S. Cl.
CPC ............ *H02S 40/345* (2014.12); *H02G 3/03* (2013.01); *H02G 3/083* (2013.01); *H02G 3/14* (2013.01); *H05K 1/0203* (2013.01); *H05K 7/2049* (2013.01)

(58) Field of Classification Search
CPC ......... H02S 40/345; H02S 40/34; H02G 3/03; H02G 3/083; H02G 3/14; H02G 3/16

USPC .................................................. 361/600–678
See application file for complete search history.

(56) References Cited

U.S. PATENT DOCUMENTS

| | | | |
|---|---|---|---|
| 8,097,818 B2 * | 1/2012 | Gerull | H02S 40/34 174/564 |
| 2010/0018572 A1 * | 1/2010 | Grimberg | H02G 3/086 136/252 |
| 2012/0033392 A1 * | 2/2012 | Golubovic | H02S 40/34 361/752 |

FOREIGN PATENT DOCUMENTS

WO WO-2009129405 A2 * 10/2009

* cited by examiner

*Primary Examiner* — Zachary Pape
(74) *Attorney, Agent, or Firm* — Rosenberg, Klein & Lee

(57) ABSTRACT

A detachable split solar power optimization junction box module has split junction boxes (1A, 1B, 1C) each having a base part and an upper cover part. String ports (11) are provided in a base (10) of the base part for electrically connecting a string of a photovoltaic module (40). The upper cover part has an upper cover (20) with a circuit board (21) provided therein. The circuit board (21) has a power optimization module connected with electrical connection pieces (22). The electrical connection pieces (22) are detachably inserted into the string ports (11) so that the power optimization module performs power optimization on the string of the photovoltaic module. The split junction boxes (1A, 1B, 1C) are used for power optimization at the string level. The power optimization module is integrated in the upper cover part that detachably connects with the base part for convenience of installation and maintenance.

6 Claims, 8 Drawing Sheets

DETACHABLE SPLIT SOLAR POWER OPTIMIZATION JUNCTION BOX MODULE

BACKGROUND OF THE INVENTION

1. Field of the Invention

The invention relates to a solar power optimization junction box and, in particular, to a split junction box that can perform power optimization at the string level and adopts a detachable design to reduce production and installation costs and to make maintenance easier.

2. Description of Related Art

As global demands for green energy become ardent, solar power technology has made continuous progress and gets more welcomed by all countries in the world. For any method of energy generation, increasing the production rate has always been the most important issue. In solar power, therefore, photovoltaic (PV) modules are also required under many conditions to be able to provide a maximum power output. In this case, the power optimization technology for the PV modules has received more attention. Moreover, the technology also moves toward smaller power generation units. That is, power optimization is no longer for the entire PV module, but more for strings of the PV module. Therefore, split power optimization junction boxes are proposed to optimize each of the strings on a PV module.

Currently, the usual split power optimization junction box contains a base, an optimization module and an upper cover. When it is installed in a PV module, one first attaches the base to the PV module. Afterwards, the optimization module is disposed and soldered onto the base. The base is then filled with glue to seal the optimization module therein, thereby achieving water protection and cooling protection. Finally, the upper cover is mounted onto the base to complete the installation.

As can be seen from the above installation process, it takes some curing time after filling the glue. The installation time becomes longer, and the parts occupy space. When the split power optimization junction box is abnormal or out of order and requires maintenance, the glue inside the base must be removed. This makes the maintenance difficult.

It is seen that the existing split power optimization junction box is inconvenient in both installation and maintenance. It is therefore imperative to seek a viable solution.

SUMMARY OF THE INVENTION

It is an objective of the invention to provide a detachable split solar power optimization junction box module that integrates a power optimization module inside an upper cover of a split junction box. Through the detachable electrical connection and engaging structure, the upper cover is combined in a detachable way with the base that is fixed on a PV module. Such a structure is convenient for installation and maintenance.

The detachable split solar power optimization junction box module comprises a plurality of split junction boxes. Each of the split junction boxes comprises a base part and an upper cover part that is detachably and electrically connected to the base part.

The base part comprises a base and a plurality of string ports provided thereon.

The upper cover part comprises an upper cover and a circuit board mounted in the upper cover. The circuit board is provided with a power optimization module and a plurality of electrical connection pieces that electrically connect to the power optimization module. Each of the electrical connection pieces matches and detachably connects a corresponding string port on the base.

The base part of each of the split junction boxes is fixed on a distinct PV module. Each of the string ports of the base part is electrically connected to a corresponding string on the PV module. When the upper cover part of the split junction box connects to the base part, each of the electrical connection pieces of the upper cover part is inserted into and forms an electrical connection with a respective one of the string ports. As a result, each of the strings on the PV module forms electrical connection via the string ports of the base part and the electrical connection pieces of the upper cover part. Furthermore, the power optimization module in the upper cover part performs power optimization to the strings.

According to the invention, the base part of the split junction box is fixed to the PV module. The string ports on the base part electrically connect to the strings. The upper cover part integrates the power optimization module within the upper cover, and forms an electrical connection with the base part in a detachable way. To assemble, one simply installs the base part on the PV module, and engages the upper cover part to the base part. This quickly completes the installation, without wasting time in waiting for the glue to cure. When any split junction box needs repair, one merely takes off the upper cover part of the split junction box and replaces it with a new upper cover part. The repair can be done immediately. The malfunctioning upper cover parts can be collected and repaired elsewhere. It is thus seen that the detachable split solar power optimization junction box module of the invention achieves the goals of easy installation and on-site maintenance.

DETAILED DESCRIPTION OF THE PREFERRED EMBODIMENT

Figure 1:
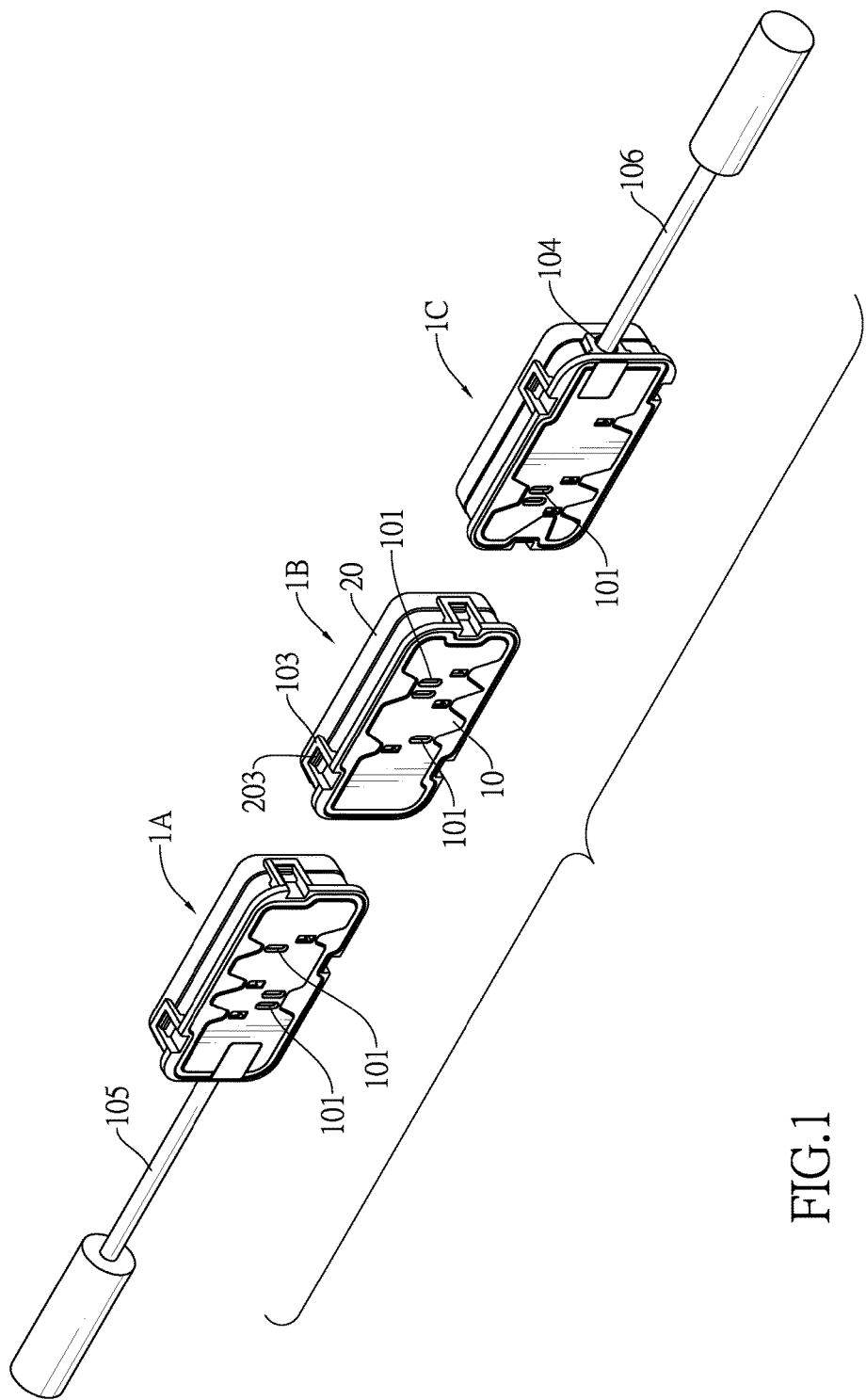
FIG. 1 shows a perspective view of a junction box module of the invention.
Figure 2:
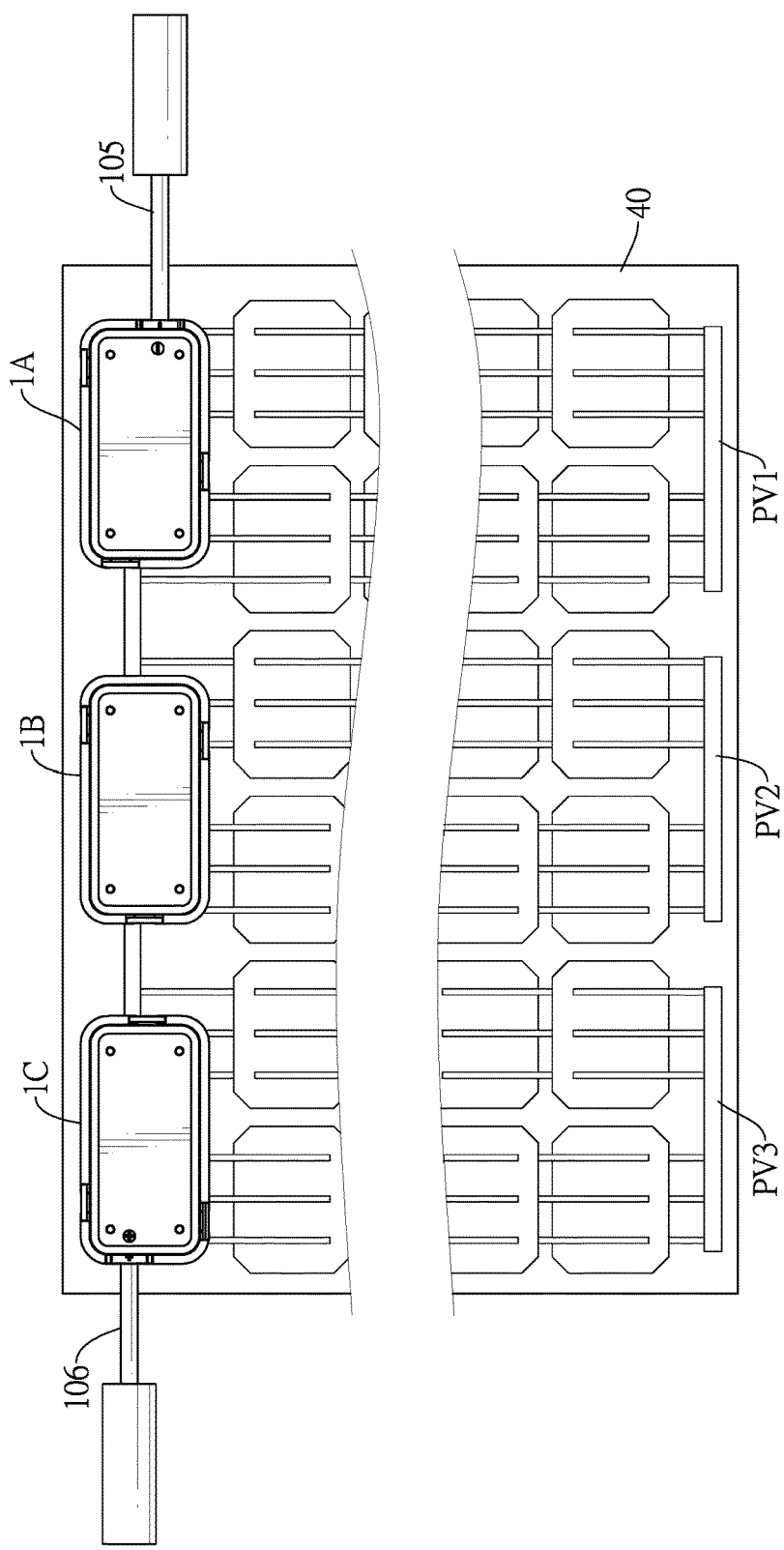
FIG. 2 is a planar view of the junction box module of invention installed on a PV module.

As shown in FIG. 1, the disclosed junction box module comprises a plurality of split junction boxes 1A, 1B, 1C. As shown in FIG. 2, each of the split junction boxes 1A, 1B, 1C is installed on a photovoltaic (PV) module 40, and is connected respectively to one of multiple strings PV1, PV2, PV3 on the PV module 40. The number of the junction boxes of the junction box module matches that of the strings on the PV module 40. That is, the split junction boxes 1A, 1B, 1C are connected respectively to the strings PV1, PV2, PV3. In this embodiment, the PV module 40 has three strings PV1, PV2, PV3. Therefore, the junction box module also comprises three split junction boxes 1A, 1B, 1C.

Figure 3:
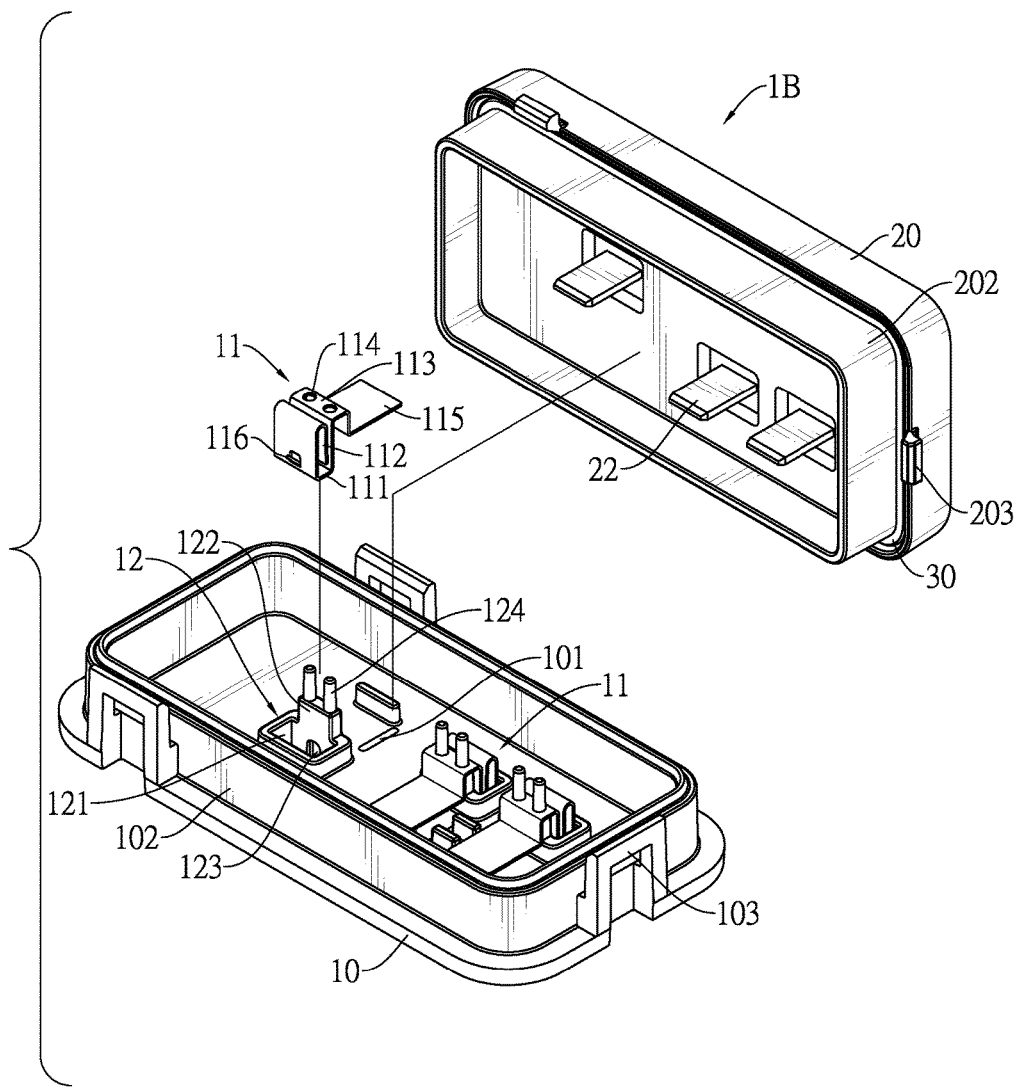
FIG. 3 is an exploded perspective view of a split junction box, showing the relation of the base part and the upper cover part of the split junction box.

The basic structures of the split junction boxes 1A, 1B, 1C are the same. Take one split junction box 1B as an example. As shown in FIG. 3, the split junction box comprises a base part and an upper cover part detachably mounted on the base part. The base part comprises a base 10 having a back part formed with a plurality of through holes 101 for copper belts to go through. An electrical connection with a respective one of the strings of the PV module is achieved through one of the copper belts.

A lower wall 102 is formed around a periphery on a back surface of the base 10. Multiple string ports 11 are provided inside the lower wall 102. Multiple buckles 103 are provided outside the lower wall 102 on the back part of the base 10 for engaging the upper cover part. In this embodiment, each buckle 103 has an inverted U shape.

Figure 4:
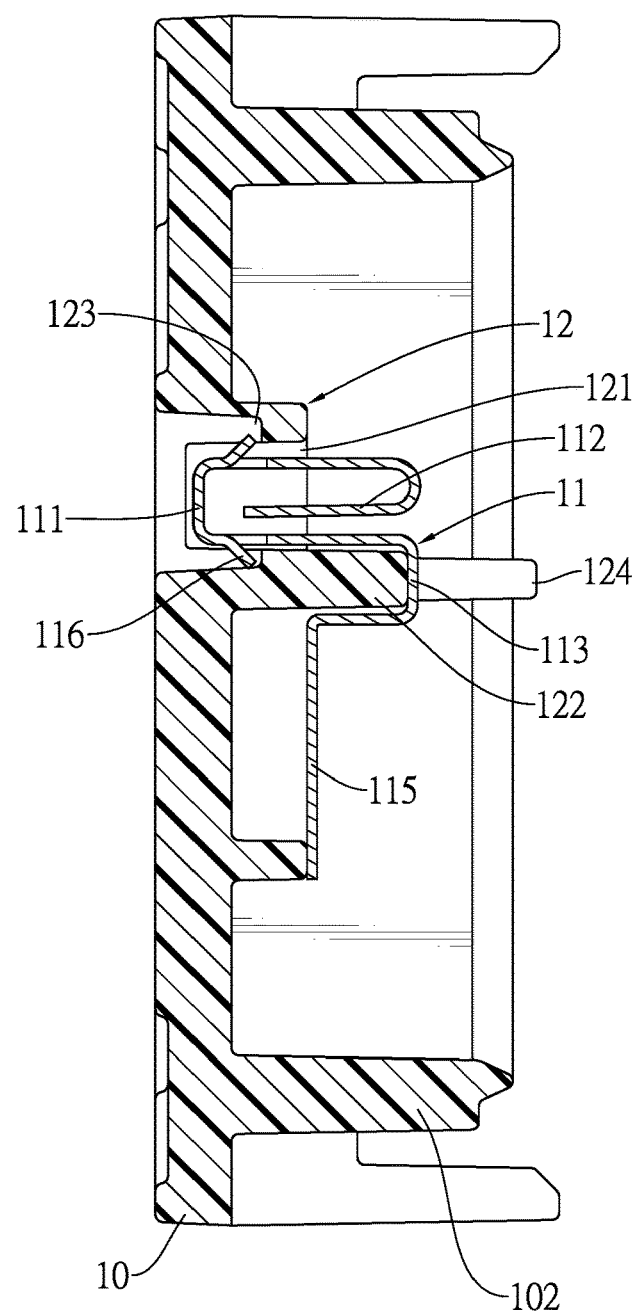
FIG. 4 is a cross-sectional view of the base part of the split junction box according to the invention.

With reference to FIGS. 3 and 4, each of the string ports 11 is formed by bending a conductive metal sheet, with one end of the conductive metal sheet forming a U-shaped inserting part 111. The inserting part 111 has two pinnacles, one extending toward the interior of the inserting part 111 to form a contact spring 112 and the other extending horizontally to form a saddle part 113. The saddle part 113 is formed with two fixing holes 114. On the end opposite to the inserting part 111, the saddle part 113 is formed with an L-shaped electrical connection part 115. The electrical connection part 115 corresponds to the through holes 101 on the back part of the base 10 in order to be soldered with the copper belts inserted through the through holes 101. The inserting part 111 is punched to form two protruding pieces 116 respectively on the two opposite outer sidewalls to enhance the fixing effect.

To firmly combine the string ports 11, the inner surface on the back part of the base 10 is formed with multiple installation platforms 12. Each of the installation platforms 12 comprises a concave accommodation chamber 121 and a wall part 122 protruding from one edge of the accommodation chamber 121. The accommodation chamber 121 accommodates the inserting part 111 of the corresponding string port 11. Two concave grooves 123 are respectively formed on the two opposite sidewalls of the accommodation chamber 121 and correspond to the protruding pieces 116 on the two opposite outer sidewalls of the inserting part 111. The protruding pieces 116 engage the two concave grooves 123 and enhance the fixing effect.

Two protruding pillars 124 are formed on the wall part 122. The saddle part 113 of the string port 11 strides across the wall part 122. The fixing holes 114 of the saddle part 113 are for the protruding pillars 124 on the wall part 122 to go through, thereby firmly fixing the string port 11 onto the installation platform 12.

Figure 5:
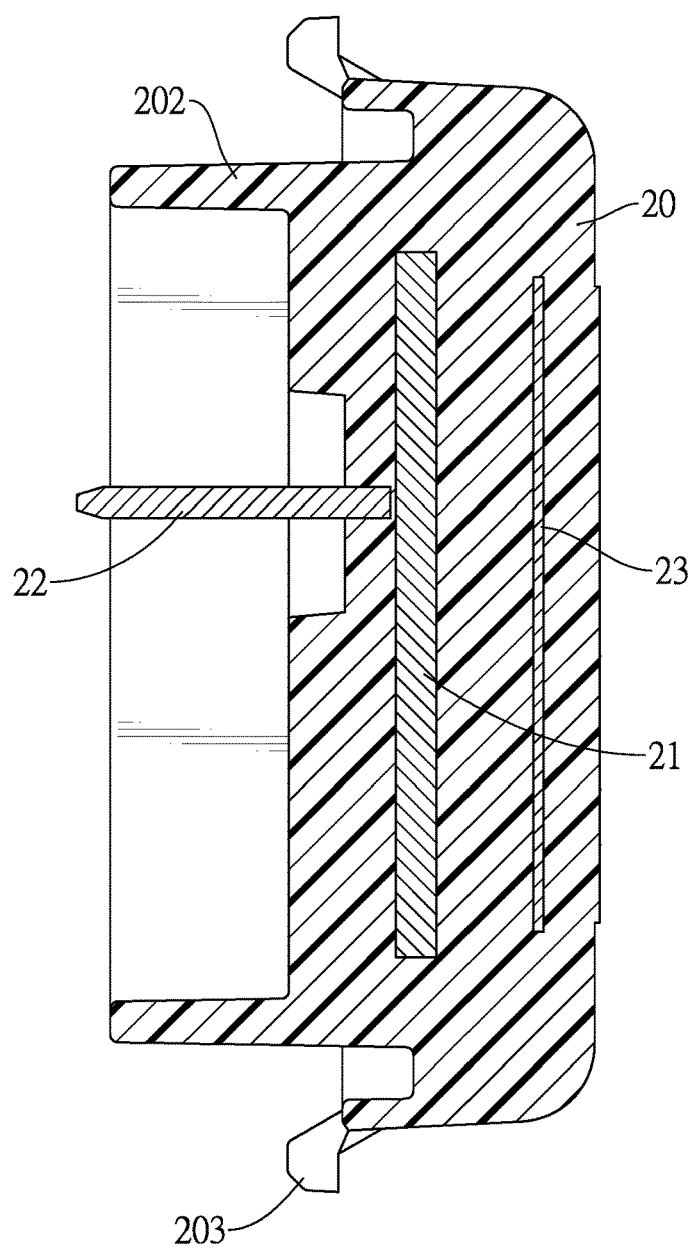
FIG. 5 is a cross-sectional view of the upper cover part of the split junction box according to the invention.

As shown in FIGS. 3 and 5, the upper cover part has an upper cover 20 having a top part. An upper wall 202 is formed around the top part. The space formed by the top part and the upper wall 202 is provided with a circuit board 21. The circuit board 21 is provided with multiple electrical connection pieces 22 and a power optimization module. Each of the electrical connection pieces 22 matches with one of the string ports 11 on the base 10, forming electrical connections by insertion. The top part of the upper cover 20 is provided with multiple engaging blocks 203 outside the upper wall 202 of the top part. Each of the engaging blocks 203 corresponds to one of the buckles 103 on the base 10, so that they are connected in a detachable way.

Figure 6:
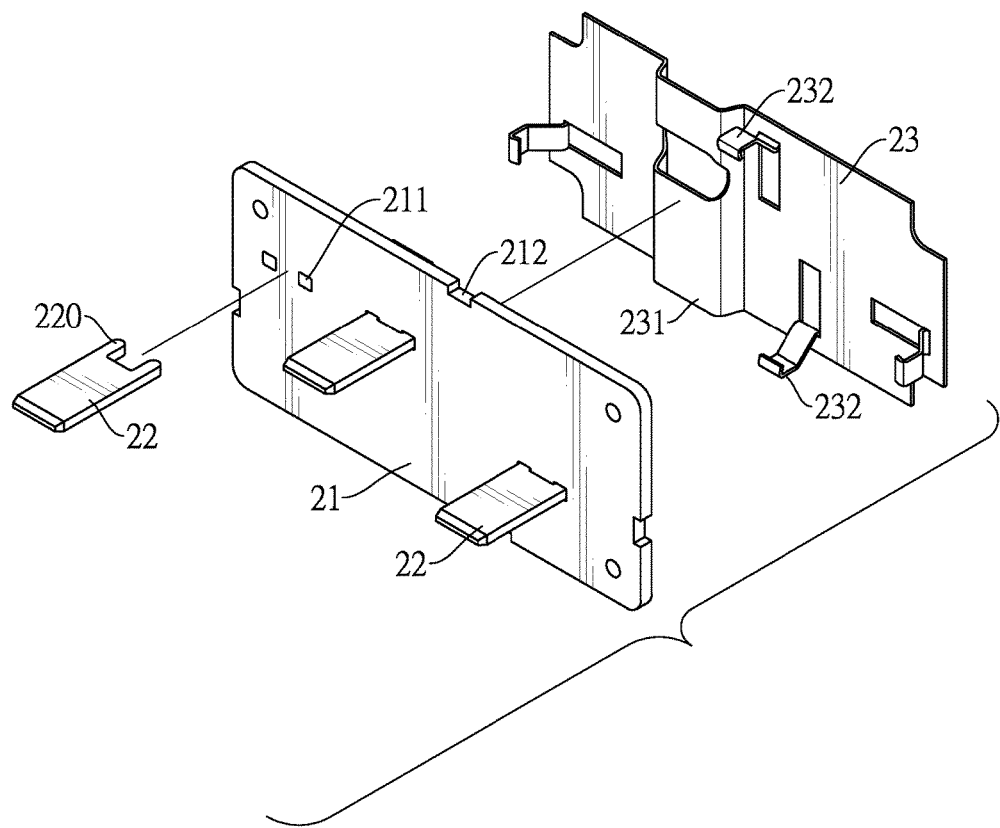
FIG. 6 is an exploded perspective view showing a circuit board and a heat sink mounted inside the upper cover part of the invention.

The power optimization module on the circuit board 21 may generate high heat while performing power optimization. To ensure that the operation of power optimization module is not affected by the heat, the upper cover 20 in this embodiment further has a heat sink 23. The structures of the circuit board 21 and the heat sink 23 can be found in FIG. 6. The heat sink 23 is formed with one or multiple protruding parts 231, which contact the primary elements (e.g., MCU) of the power optimization module on the circuit board 21 for heat dissipation. Moreover, the heat sink 23 is provided with multiple claws 232 to engage with the circuit board 21.

Multiple notches 212 are formed around the circuit board 21 for the claws 232 of the heat sink 23 to catch. The circuit board 21 is formed with multiple sets of paired conductive holes 211 so as to electrically connect to the pins 220 protruding from the bottom ends of the electrical connection pieces 22. Each of the conductive holes 211 is connected to the power optimization module provided on the circuit board 21. When the upper cover part and the base part combine and the electrical connection pieces 22 are inserted into the string ports 11 on the base 10, the power optimization module on the circuit board 21 can perform power optimization on the strings connected to the string ports 11.

Please refer to FIGS. 3 and 5 for the structure of the upper cover part. In this embodiment, the circuit board 21 and the heat sink 23 are completely enclosed and sealed inside the upper cover 20. A feasible sealing method is to fill the upper cover 20 with highly thermally conductive glue. Alternatively, one can also form the upper cover 20 outside the circuit board 21 and the heat sink 23 by injection molding. The injection molding material is preferably to have a high thermal conductivity so that the heat sink 23 has a heat dissipation effect. Only the electrical connection pieces 22 are exposed from the sealed circuit board 21 for electrical connections with the string ports 11 on the base 10.

A waterproof ring 30 is provided around the upper wall 202 of the upper cover 20 to enhance the waterproof effect at the junction between the upper cover 20 and the base 10.

As described before, the basic structures of the split junction boxes 1A, 1B, 1C are the same. The only differences are in the number and positions of the string ports 11 and the electrical connection pieces 22. The layout is made according to the power output terminals of the strings PV1, PV2, PV3 of the PV module 40. Besides, as shown in FIG. 1, a cable port 104 is formed on the base 10 of each of the split junction boxes 1A, 1C for accommodating a cable 105, 106. The cables 105, 106 are connected respectively to a string port 11 in the base 10. The junction box module can use the cables 105, 106 to connect to other PV modules in series, thereby linking the electrical power loop.

The above describes the structure of the invention. The following describes how the invention is used.

Figure 7:
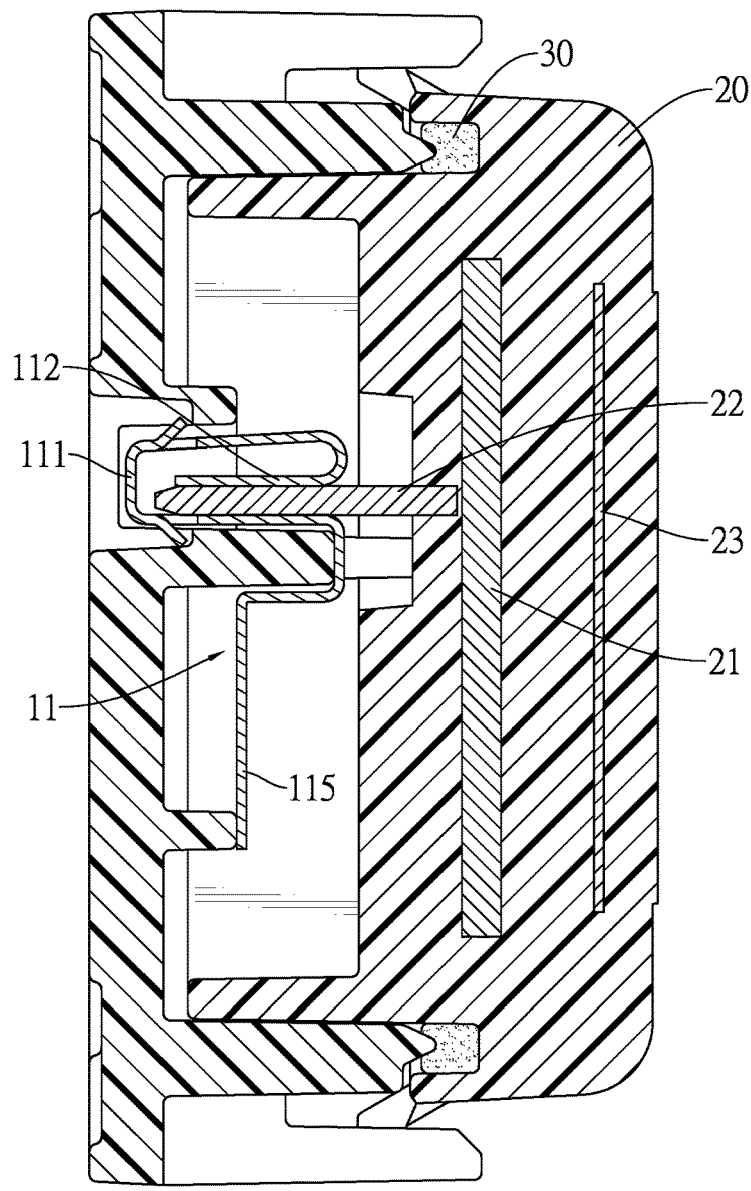
FIG. 7 is a cross-sectional view of the split junction box of the invention.

To install the junction box module to the PV module 40, the base 10 of each of the split junction boxes 1A, 1B, 1C is mounted to the PV module 40. The copper belts are soldered to the string ports 11 on the base and the strings of the PV module 40 to form electrical connections. Afterwards, the electrical connection pieces 22 on the upper cover 20 are inserted into the string ports 11 on the base 10. As shown in FIG. 7, when the electrical connection pieces 22 are inserted into the inserting parts 111 of the string ports 11, the contact springs 112 are pushed by the electrical connection pieces 22. The elasticity of the contact springs 112 ensures the contact between the electrical connection pieces 22 and the contact springs 112 as well as the inserting parts 111, establishing electrical connections.

Figure 8:
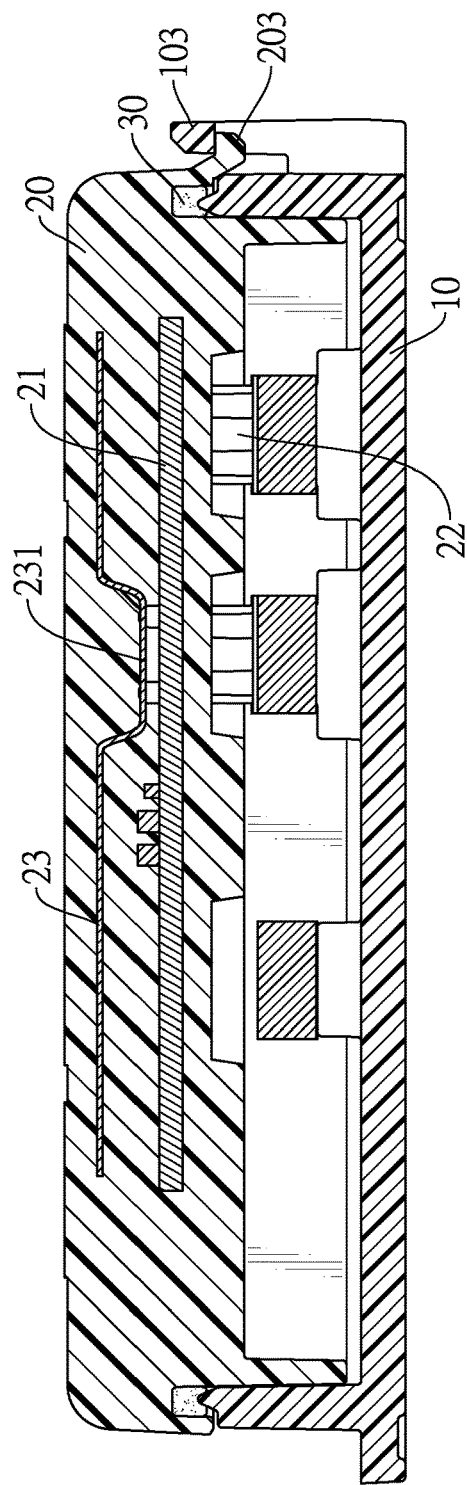
FIG. 8 is another cross-sectional view of the split junction box of the invention.

With reference to FIG. 8, when the electrical connection pieces 22 of the upper cover 20 are inserted into the string ports 11 of the base 10, the engaging blocks 203 of the upper cover 20 engage with the buckles 103 on the base 10, thereby firmly combining the upper cover 20 and the base 10. Moreover, the waterproof ring 30 between the upper cover 20 and the base 10 provides a good waterproof effect.

With the above-mentioned design, the invention integrates the power optimization module inside the upper cover part and seals it. Therefore, the installation does not need to wait until the glue cures. Therefore, the invention can shorten the installation time and reduces the installation cost. Moreover, if some split junction box is abnormal or out of order, one simply replaces the upper cover part with a new one. This enables rapid repair and reduces the maintenance cost.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A detachable split solar power optimization junction box module, comprising a plurality of split junction boxes (1A, 1B, 1C) with each of which having a base part and an upper cover part that connects to the base part in a detachable way to form an electrical connection, wherein
    the base part has a base (10) with a plurality of string ports (11) provided thereon; and
    the upper cover part has an upper cover (20) with a circuit board (21) provided therein, the circuit board (21) is provided with a power optimization module and a plurality of electrical connection pieces (22) electrically connected with the power optimization module, and each of the electrical connection pieces (22) matches one of the string ports (11) on the base (10) for corresponding insertion in a detachable way;
    wherein the base (10) of the base part has a back part formed with a plurality of through holes (101);
    a lower wall (102) is formed around the back part of the base (10) to accommodate the string ports (11) therein;
    a plurality of buckles (103) are provided outside the lower wall (102) of the back part of the base (10);
    the upper cover (20) of the upper cover part has a top part and an upper wall (202) is formed around the top part, with a space formed by the top part and the upper wall (202) being provided with the circuit board (21); and
    a plurality of engaging blocks (203) are provided outside the upper wall (202) of the top part of the upper cover (20), with each of the engaging blocks (203) corresponding to one of the buckles (103) on the base (10);
    wherein the upper cover (20) is provided with a heat sink (23) therein; the heat sink (23) is formed with a protruding part (231) and a plurality of claws (232); and
    a plurality of notches (212) are formed at a periphery of the circuit board (21) for the claws (232) of the heat sink (23) to engage.

2. The junction box module of claim 1, wherein the circuit board (21) is formed with a plurality of sets of paired conductive holes (211); each of the conductive holes (211) is connected to the power optimization module on the circuit board; and each of the electrical connection pieces (22) has two pins (220) to be inserted into the conductive holes (211) on the circuit board (21).

3. The junction box module of claim 1, wherein the number of the split junction boxes (1A, 1B, 1C) is three and two of the split junction boxes (1A, 1C) are formed with a cable port on the base (10) thereof for accommodating a cable (105, 106), and each of the cables (105, 106) is connected to a string port (11) in the associated base (10).

4. A detachable split solar power optimization junction box module, comprising a plurality of split junction boxes (1A, 1B, 1C) with each of which having a base part and an upper cover part that connects to the base part in a detachable way to form an electrical connection, wherein
    the base part has a base (10) with a plurality of string ports (11) provided thereon; and
    the upper cover part has an upper cover (20) with a circuit board (21) provided therein, the circuit board (21) is provided with a power optimization module and a plurality of electrical connection pieces (22) electrically connected with the power optimization module, and each of the electrical connection pieces (22) matches one of the string ports (11) on the base (10) for corresponding insertion in a detachable way; wherein
    each of the string ports (11) is formed by bending a conductive metal sheet, with one end forming a U-shaped inserting part (111) that has two pinnacles, with one of the two pinnacles extending toward interior of the inserting part (111) to form a contact spring (112) and the other pinnacle extending horizontally to form a saddle part (113), and the saddle part (113) being formed with an electrical connection part (115) on an end opposite to the inserting part (111); and
    a plurality of installation platforms (12) are formed on the base (10), with each of the installation platforms (12) including a concave accommodation chamber (121) and a wall part (122) protruding from one edge of the accommodation chamber (121), and the saddle part (113) strides across the wall part (122).

5. The junction box module of claim 4, wherein the wall part (122) of each of the installation platforms (12) is formed with two protruding pillars (124), and the saddle part (113) is formed with two fixing holes (114) for the two protruding pillars (124) of the wall part (122) to go through, respectively.

6. The junction box module of claim 4, wherein the number of the split junction boxes (1A, 1B, 1C) is three and two of the split junction boxes (1A, 1C) are formed with a cable port on the base (10) thereof for accommodating a cable (105, 106), and each of the cables (105, 106) is connected to a string port (11) in the associated base (10).

* * * * *